United States Patent
Lee et al.

(10) Patent No.: US 6,824,951 B2
(45) Date of Patent: Nov. 30, 2004

(54) PHOTORESIST COMPOSITION FOR RESIST FLOW PROCESS

(75) Inventors: Geun Su Lee, Kyoungki-do (KR); Jin Soo Kim, Daejeon-shi (KR); Jae Chang Jung, Kyoungki-do (KR); Min Ho Jung, Kyoungki-do (KR); Ki Ho Baik, Kyoungki-do (KR)

(73) Assignee: Hynix Semiconductor Inc., Kyungki-do (KR)

( * ) Notice: Subject to any disclaimer, the term of this patent is extended or adjusted under 35 U.S.C. 154(b) by 145 days.

(21) Appl. No.: 09/947,625

(22) Filed: Sep. 6, 2001

(65) Prior Publication Data

US 2002/0048723 A1 Apr. 25, 2002

(30) Foreign Application Priority Data

Oct. 23, 2000 (KR) ........................................ 2000-62267

(51) Int. Cl.[7] ............................................... G03F 7/004
(52) U.S. Cl. ..................... 430/270.1; 430/905; 430/910
(58) Field of Search .............................. 430/270.1, 905, 430/910

(56) References Cited

U.S. PATENT DOCUMENTS

| | | | |
|---|---|---|---|
| 6,136,500 A | * 10/2000 | Kobayashi et al. | 430/270.1 |
| 6,444,397 B2 | * 9/2002 | Hada et al. | 430/270.1 |
| 6,458,506 B2 | * 10/2002 | Cameron | 430/270.1 |
| 6,664,022 B1 | * 12/2003 | Cameron et al. | 430/270.1 |

FOREIGN PATENT DOCUMENTS

JP 09166870 * 6/1997

OTHER PUBLICATIONS

Partial English translation of JP 09166870, Jun. 1997 from the Japanese website www.ipdl.jpo.go.jp/homepg_e.ipdl.*

* cited by examiner

Primary Examiner—Rosemary Ashton
(74) Attorney, Agent, or Firm—Marshall, Gerstein & Borun LLP

(57) ABSTRACT

A photoresist composition for a resist flow process and a method for forming a contact hole using the same. When a photoresist composition comprising a crosslinking agent of following Formula 1 or Formula 2, is used for a photoresist pattern formation process, it improves resist flow properties, L/S pattern resolution and contrast ratio.

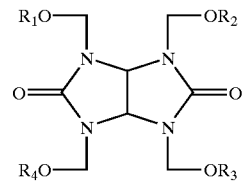

Formula 1 wherein $R_1$, $R_2$, $R_3$ and $R_4$ individually represent H or substituted or unsubstituted linear or branched ($C_1$–$C_{10}$) alkyl.

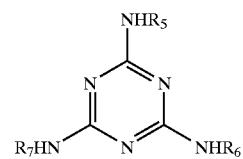

Formula 2 wherein $R_5$, $R_6$ and $R_7$ individually represent H, substituted or unsubstituted linear or branched ($C_1$–$C_{10}$) alkyl or substituted or unsubstituted linear or branched ($C_1$–$C_{10}$) alkoxy.

9 Claims, 10 Drawing Sheets

PHOTORESIST COMPOSITION FOR RESIST FLOW PROCESS

BACKGROUND

1. Technical Field

A photoresist composition for resist flow process and a method for forming a contact hole using the same are disclosed. In particular, a photoresist composition comprising a crosslinking agent represented by Formula 1 or Formula 2 which improves resist flow properties, L/S pattern resolution and contrast ratio is disclosed.

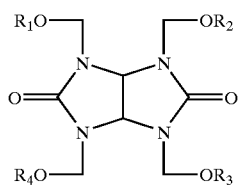

Formula 1 wherein $R_1$, $R_2$, $R_3$ and $R_4$ individually represent H; or substituted or unsubstituted linear or branched ($C_1$–$C_{10}$) alkyl.

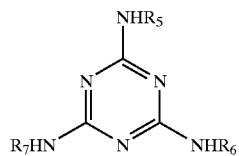

Formula 2 wherein $R_5$, $R_6$ and $R_7$ individually represent H; substituted or unsubstituted linear or branched ($C_1$–$C_{10}$) alkyl; or substituted or unsubstituted linear or branched ($C_1$–$C_{10}$) alkoxy.

2. Description of the Related Art

Resist flow is a processing technology for forming a fine contact hole which exceeds the resolution of the exposing device.

The resist flow process has recently made remarkable developments and so that it is now used in mass production processes. The technology generally involves an exposure process and a development process. This process forms a photoresist contact hole having a resolution equal to that of the exposing device. The process also includes heating the photoresist to a temperature higher than the glass transition temperature of the photoresist which causes the photoresist to flow. The contact hole gets smaller by the flow of photoresist until a fine contact hole necessary for the integration process is obtained.

Thus, the resist flow process makes it possible to obtain contact holes smaller than the resolution of an exposing device. Unfortunately, the resist flow process can result in a sudden or excessive photoresist resin flow (i.e., "overflow") which may result in a bent or collapsed contact hole pattern profile. This problem occurs typically at a temperature higher than the glass transition temperature of the photoresist resin.

The overflow can occur due to several factors including photoresist's sensitivity to heat, imprecise temperature control, and imprecise control of the flow time.

For example, when the conventional photoresist is used, a bent or collapsed contact hole pattern may occur. Without being bound by any theory, it is believed that this is due to the difference in flowable amount of the polymer present in the upper, center and lower portions of the contact hole pattern. Normally, the amount of flowable polymers in the upper and lower portions is relatively less than that of in the central portion. Therefore, when the same amount of heat energy is irradiated to the photoresist film, the upper and lower portions of photoresist less flow than the central portion of photoresist to form bent patterns.

Attempts to solve the overflow problem by improving the baking process, such as maintaining a uniform baking temperature and/or controlling the precise baking time, have been mostly unsuccessful. In addition, the baking process itself was found to be ineffective to solve the overflow and the bent pattern problems.

SUMMARY OF THE DISCLOSURE

An improved photoresist composition for resist flow process is disclosed.

An improved resist flow process for forming a photoresist pattern using such photoresist composition is also disclosed.

A contact hole formation method employing the photoresist pattern formed by the above-described process is also disclosed.

DETAILED DESCRIPTION OF THE PRESENTLY PREFERRED EMBODIMENTS

Figure 1A:
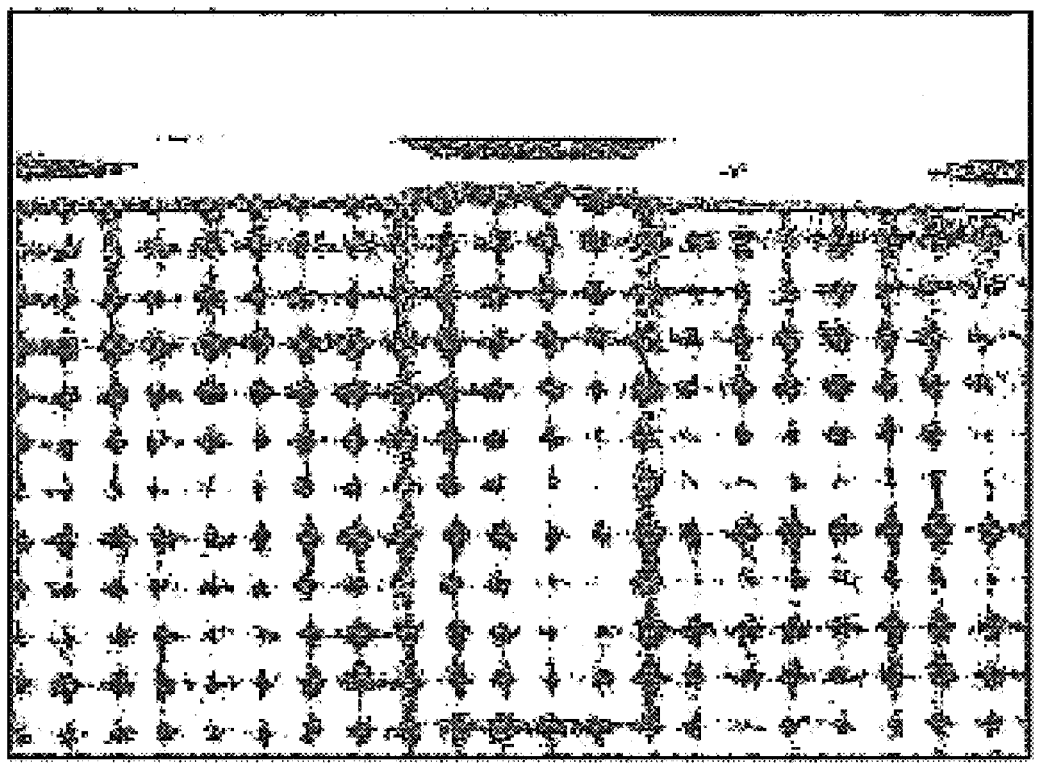
FIGS. 1A to 1C show photoresist patterns of Invention Example 8.

During a resist flow process using a conventional photoresist composition, due to excessive photoresist resin flow, contact hole pattern may collapse. However, this problem is overcome by using a crosslinking agent.

The disclosed photoresist compositions comprise a crosslinking agent of following Formula 1 or 2.

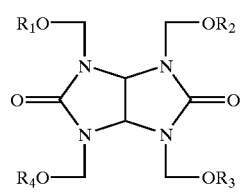

Formula 1 wherein $R_1$, $R_2$, $R_3$ and $R_4$ individually represent H; or substituted or unsubstituted linear or branched ($C_1$–$C_{10}$) alkyl.

Formula 2

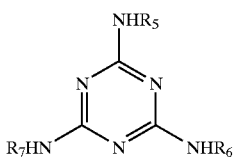

wherein $R_5$, $R_6$ and $R_7$ individually represent H; substituted or unsubstituted linear or branched ($C_1$–$C_{10}$) alkyl; or substituted or unsubstituted linear or branched ($C_1$–$C_{10}$) alkoxy.

Preferably, the compound of Formula 1 is 1,3,4,6-tetrakis (butoxy methyl) glycoluril, and the compound of Formula 2 is melamine.

The crosslinking agent is used in an amount ranging from about 1 to about 20% based upon the weight of the photoresist polymer.

Previously, crosslinking agents were used for forming a negative pattern by inducing a crosslinking reaction between photoresist polymers in a part where it is exposed to the light, thereby preventing the exposed part from dissolving in a developing solution. In contrast, the crosslinking agents of Formula 1 or 2 are employed to improve the resist flow property and the contrast ratio of the pattern when the resist flow process is carried out on a primarily formed positive pattern.

That is, during the flow bake process, the photoresist compositions containing the crosslinking agents disclosed herein have part of the photoresist polymers to be linked when they are heated, thereby increasing molecular weight of the polymers and raising the glass transition temperature. In this manner, the flow of the polymers at a certain temperature is changed, and makes it possible to obtain smooth flow sensitivity to accomplish the intended process margin.

In addition, the photoresist polymer can be any one of many known chemically-amplified polymers, some of which are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0789 278 (Aug. 13, 1997), U.S. Pat. No. 6,132,926 (Oct. 17, 2000) and so on. Preferably the photoresist polymer is selected from the compounds of Formulas 3 to 5.

Formula 3

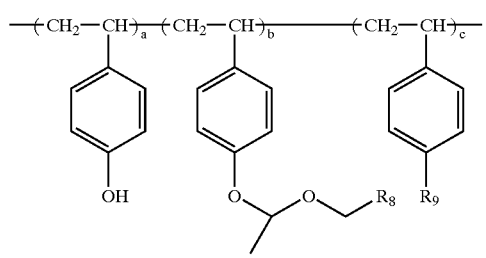

wherein $R_8$ and $R_9$ individually represent H; substituted or unsubstituted linear or branched ($C_1$–$C_{10}$) alkyl; or substituted or unsubstituted ($C_3$–$C_{20}$) aryl; and the ratio of a:b:c is 20–70 mol %:10–70 mol %:0–50 mol %.

Formula 4

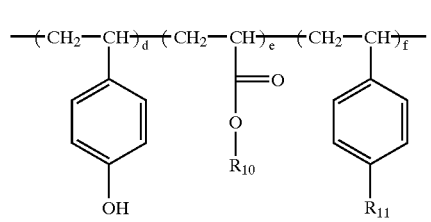

wherein $R_{10}$ is an acid labile protecting group;
$R_{11}$ represents H; substituted or unsubstituted linear or branched ($C_1$–$C_{10}$) alkyl; or substituted or unsubstituted ($C_3$–$C_{20}$) aryl; and
the ratio of d:e:f is 20–70 mol %:10–70 mol %:0–50 mol %.

Formula 5 wherein $R_{12}$ represents H; substituted or unsubstituted linear or branched chain ($C_1$–$C_{10}$) alkyl; or substituted or unsubstituted linear or branched chain ($C_1$–$C_{10}$) alkyl alcohol;
$R_{13}$ is an acid labile protecting group;
$R_{14}$, $R_{15}$, $R_{16}$, and $R_{17}$ individually represent H; or substituted or unsubstituted linear or branched chain ($C_1$–$C_{10}$) alkyl;
$R_{18}$ and $R_{19}$ individually represent H or $CH_3$;
Y represents substituted or unsubstituted linear or branched chain ($C_1$–$C_{10}$) alkylene or substituted or unsubstituted linear or branched chain ($C_1$–$C_{10}$) alkylene containing an ether (—O—) group;
n is an integer from 0 to 2; and
the ratio of g:h:i:j:k is 1–20 mol %:0–20 mol %:10–50 mol %:40–50 mol %:0–10 mol %.

The acid labile protecting group in Formulas 4 and 5 is can be any of the known protective groups that can be substituted by an acid and functions to prevent the compound to which the group is bound from dissolving in the alkaline developing solution. Conventional acid labile protecting groups are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0789 278 (Aug. 13, 1997) and U.S. Pat. No. 6,132,926 (Oct. 17, 2000). Preferable acid labile protecting groups are selected from the group consisting of tert-butyl, tetrahydropyran-2-yl, 2-methyl tetrahydropyran-2-yl, tetrahydrofuran-2-yl, 2-methyl tetrahydrofuran-2-yl, 1-methoxypropyl, 1-methoxy-1-methylethyl, 1-ethoxypropyl, 1-ethoxy-1-methylethyl, 1-methoxyethyl, 1-ethoxyethyl, tert-butoxyethyl, 1-isobutoxyethyl and 2-acetylmenth-1-yl.

The photoacid generator and organic solvent for the conventional photoresist composition can be used in photoresist compositions of the present invention.

Any conventional photoacid generator, which is able to generate acids by light, can be used in photoresist composition of the present invention. Some of conventional photoacid generators are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0789 278 (Aug. 13, 1997) and U.S. Pat. No. 6,132,926 (Oct. 17, 2000).

Preferred photoacid generators have a relatively low light absorbency in the wavelengths of 157 nm and 193 nm. More preferably, the photoacid generator is selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, triphenylsulfonium hexafluoroarsenate, triphenylsulfonium hexafluoroantimonate, triphenylsulfonium triflate, dibutylnaphthylsulfonium triflate, phthalimidotrifluoromethane sulfonate, dinitrobenzyltosylate, n-decyl disulfone, naphthylimido trifluoromethane sulfonate and mixture thereof.

The photoacid generator is used in an amount of 0.01 to 10 wt % of the photoresist polymer employed.

Organic solvent can be any of known solvents as disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0789 278 (Aug. 13, 1997) and US 6,132,926 (Oct. 17, 2000).

Exemplary organic solvents suitable in photoresist compositions of the present invention include diethylene glycol diethyl ether, ethyl 3-ethoxypriopionate, methyl 3-methoxypropionate, cyclohexanone, propyleneglycol methyl ether acetate, 2-heptanone, ethyl lactate and mixture thereof.

The amount of solvent used is preferably in the range of from about 100% to about 2000% by weight of the photoresist polymer.

A process for forming a photoresist pattern comprises the steps of:

(a) coating the above described photoresist composition on underlying layer to form a photoresist film;

(b) forming a first photoresist pattern using a lithography process (preferably the first photoresist pattern has a lower resolution than the maximum resolution of an exposing device); and (c) performing a resist flow (i.e., flow bake) process onto the resultant to obtain a second photoresist pattern.

A method for preparing a contact hole uses the photoresist composition described above. In particular, underlying layer coated with the photoresist composition described above is etched using the second photoresist pattern (as described above) as an etching mask to form the underlying layer pattern.

The underlying layer pattern can be contact hole pattern or L/S pattern.

The temperature of the resist flow process of step (c) is typically at or over the glass transition temperature of the photoresist polymer, and preferably in the range of from about 120° C. to about 190° C. And, more preferable range is from 120° C. to 170° C.

Moreover, by using photoresist compositions disclosed herein, it is also possible to reduce or eliminate standing wave effect which can be observed in the first photoresist pattern prior to the resist flow process of step (c).

An improved semiconductor element can be manufactured using the photoresist composition described above.

The disclosed compositions and processes will now be described in more detail by referring to the examples below, which are not intended to be limiting.

Synthesis of Photoresist Compositions

EXAMPLE 1

The photoresist polymer of Formula 3 (10 g), in which $R_8$ is $CH_3$ and $R_9$ is H, 1,3,4,6-tetrakis(butoxymethyl)glycoluril (0.01 g), and triphenylsulfonium triflate (0.1 g) was added to 100 g of propylene glycol methyl ether acetate. The mixture was filtered through a 0.20 μm filter to yield the photoresist composition (Tg=131° C.).

EXAMPLE 2

The photoresist polymer of Formula 3 (10 g), in which $R_8$ is $C_6H_5$ (phenyl) and $R_9$ is H, 1,3,4,6-tetrakis(butoxymethyl)glycoluril (0.01 g), and triphenylsulfonium triflate (0.1 g) was added to 100 g of propylene glycol methyl ethyl acetate. The mixture was filtered through a 0.20 μm filter to yield the photoresist composition (Tg=133° C.).

EXAMPLE 3

The photoresist polymer of Formula 3 (10 g), in which $R_8$ is $CH_3$ and $R_9$ is $CH_3$, melamine (0.5 g), and triphenylsulfonium triflate (0.1 g) was added to 100 g of propylene glycol methyl ether acetate. The mixture was filtered through a 0.20 μm filter to yield the photoresist composition (Tg=135° C.).

EXAMPLE 4

The photoresist polymer of Formula 3 (10 g), in which $R_8$ is $C_6H_5$(phenyl) and $R_9$ is H, melamine (0.5 g), and triphenylsulfonium triflate (0.1 g) was added to 100 g of propylene glycol methyl ethyl acetate. The mixture was filtered through a 0.20 μm filter to yield the photoresist composition (Tg=133° C.).

EXAMPLE 5

The photoresist polymer of Formula 4 (10 g), in which $R_{10}$ is tert-butyl and $R_{11}$ is H, 1,3,4,6-tetrakis(butoxymethyl)glycoluril (0.01 g), and triphenylsulfonium triflate (0.12 g) was added to 100 g of propylene glycol methyl ethyl acetate. The mixture was filtered through a 0.20 μm filter to yield the photoresist composition (Tg=136° C.).

EXAMPLE 6

The photoresist polymer of Formula 4 (10 g), in which $R_{10}$ is tert-butyl and $R_{11}$ is H, melamine (0.5 g), and triphenylsulfonium triflate (0.12 g) was added to 100 g of propylene glycol methyl ethyl acetate. The mixture was filtered through a 0.20 μm filter to yield the photoresist composition (Tg138° C.).

EXAMPLE 7

The photoresist polymer of Formula 5 (10 g), in which $R_{12}$ is $CH_2CH_2OH$; $R_{13}$ is tert-butyl; $R_{14}$, $R_{15}$, $R_{16}$, and $R_{17}$ are respectively $CH_3$; and, $R_{18}$ and $R_{19}$ are respectively H, 1,3,4,6-tetrakis(butoxymethyl)glycoluril (0.03 g), and triphenylsulfonium triflate (0.06 g) was added to 100 g of propylene glycol methyl ether acetate. The mixture was filtered through a 0.20 μm filter to yield the photoresist composition (Tg=130° C.).

II. Synthesis of Photoresist Pattern

EXAMPLE 8

Figure 1B:
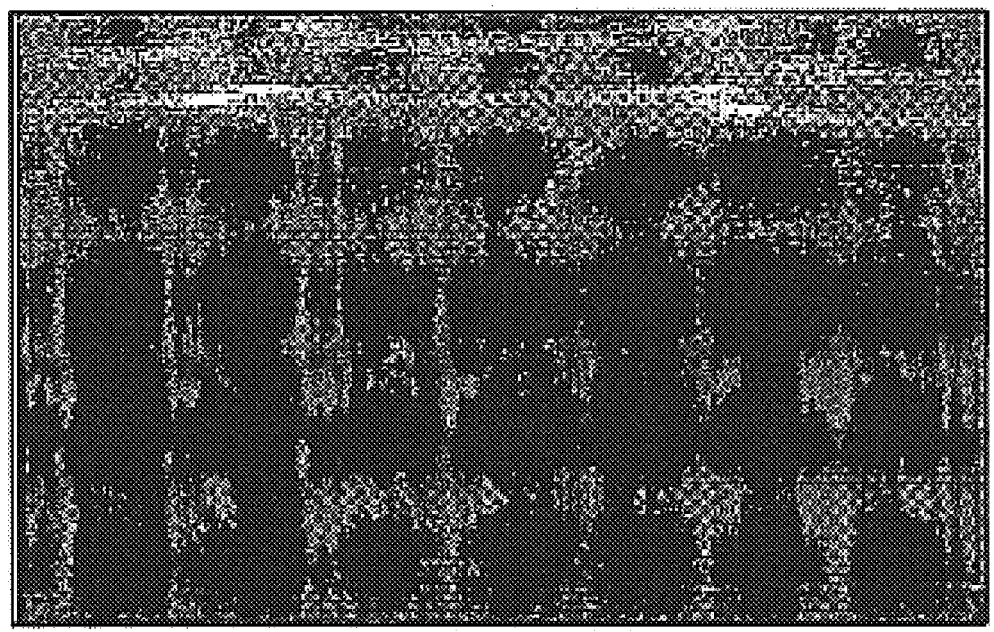
Figure 1C:
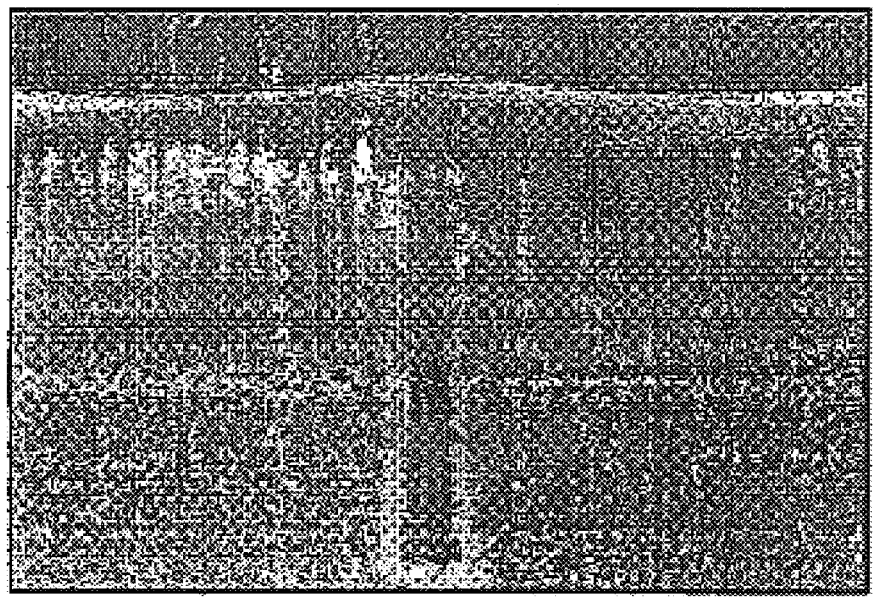

The filtered photoresist composition obtained using the procedure of Example 1 was coated on a wafer, baked at 110° C. for 90 seconds and exposed to light using a 0.06 NA KrF exposing device (Nikon S201). The photoresist composition was post-baked at 110° C. for 90 seconds and developed in 2.38 wt % aqueous TMAH solution to obtain a 230 nm L/S pattern (see FIG. 1a). The resulting pattern was flow baked at 158° C. for 90 seconds going through resist flow process to obtain 80 nm L/S pattern (see FIG. 1b). Later, the pattern was flow baked again at 160° C. for 90 seconds going through resist flow process to obtain 60 nm L/S pattern (see FIG. 1c).

EXAMPLE 9

Figure 2A:
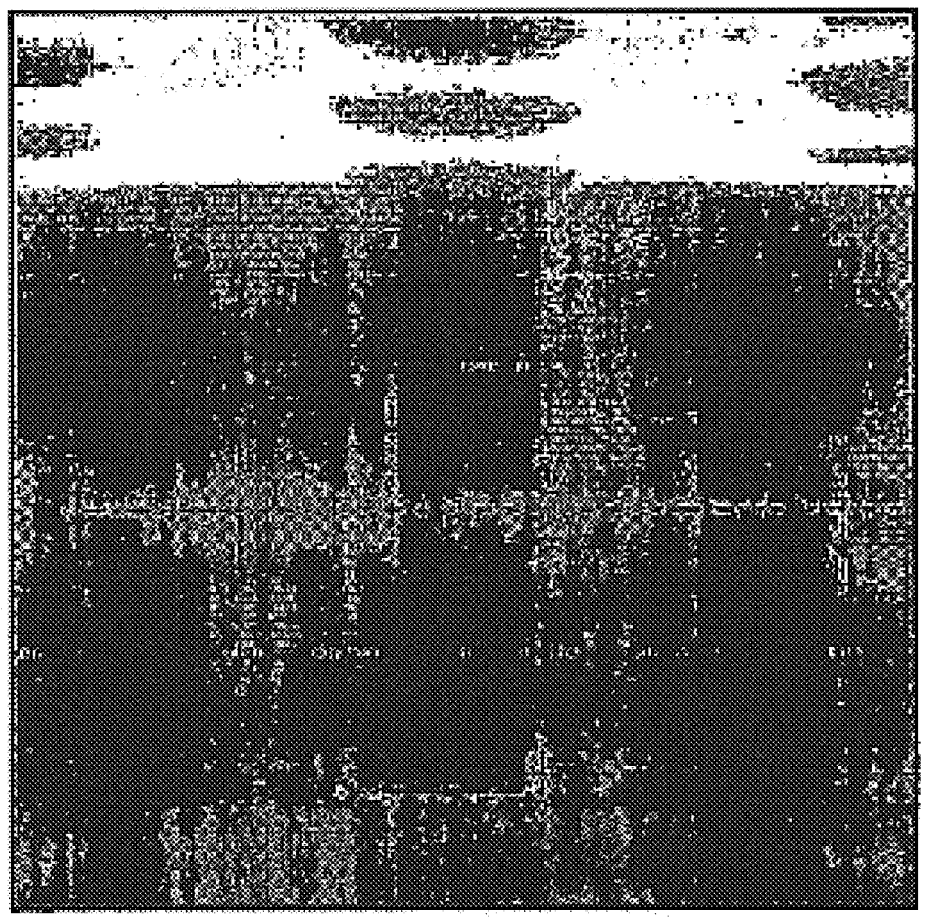
FIGS. 2A and 2B show photoresist patterns of Invention Example 9.
Figure 2B:
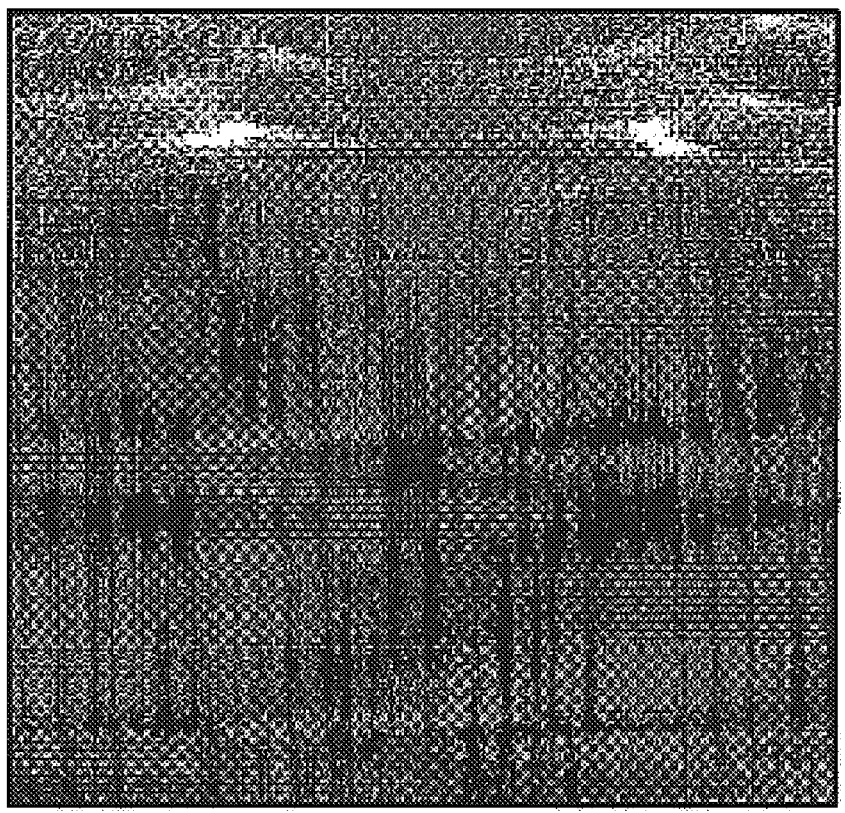

The filtered photoresist composition obtained using the procedure of Example 2 was coated on a wafer, baked at 100° C. for 90 seconds and exposed to light using a 0.06 NA KrF exposing device (Nikon S201). The photoresist composition was post-baked at 130° C. for 90 seconds and developed in 2.38 wt % aqueous TMAH solution to obtain a 230 nm L/S pattern (see FIG. 2a). The resulting pattern was flow baked at 153° C. for 90 seconds going through resist flow process to obtain 100 nm L/S pattern (see FIG. 2b).

EXAMPLE 10

Figure 3:
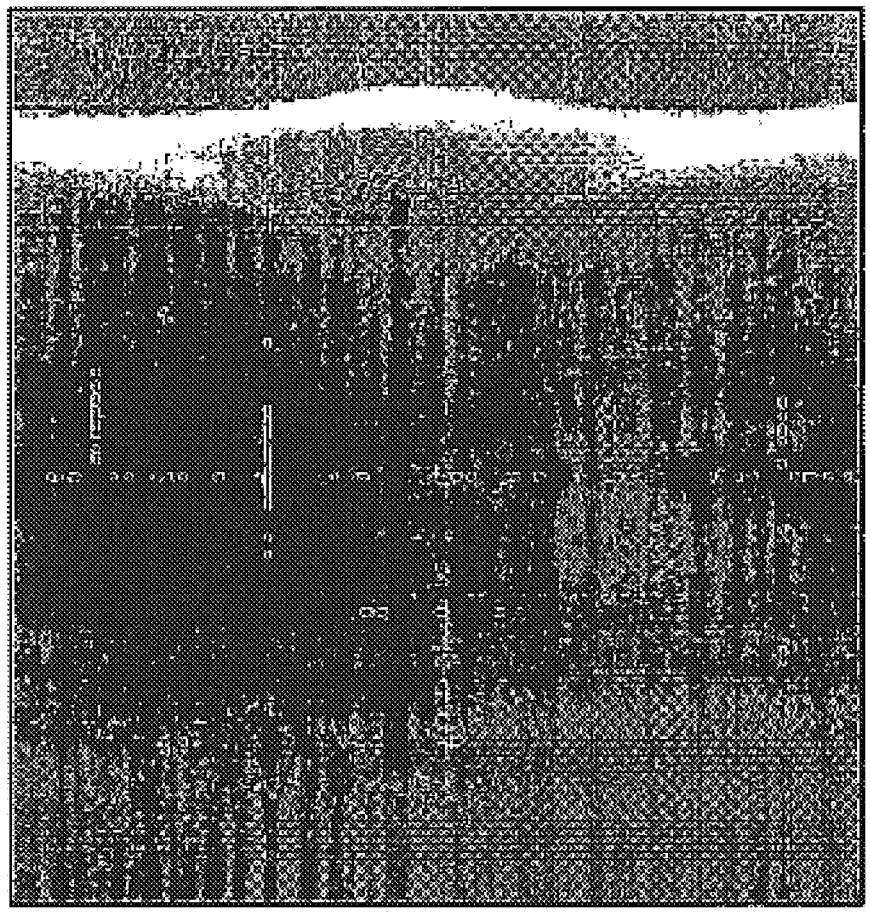
FIG. 3 shows a photoresist pattern of Invention Example 10.

The procedure of Example 8 was repeated but using the photoresist composition prepared in Example 3, to obtain 70 nm L/S pattern (see FIG. 3).

EXAMPLE 11

Figure 4:
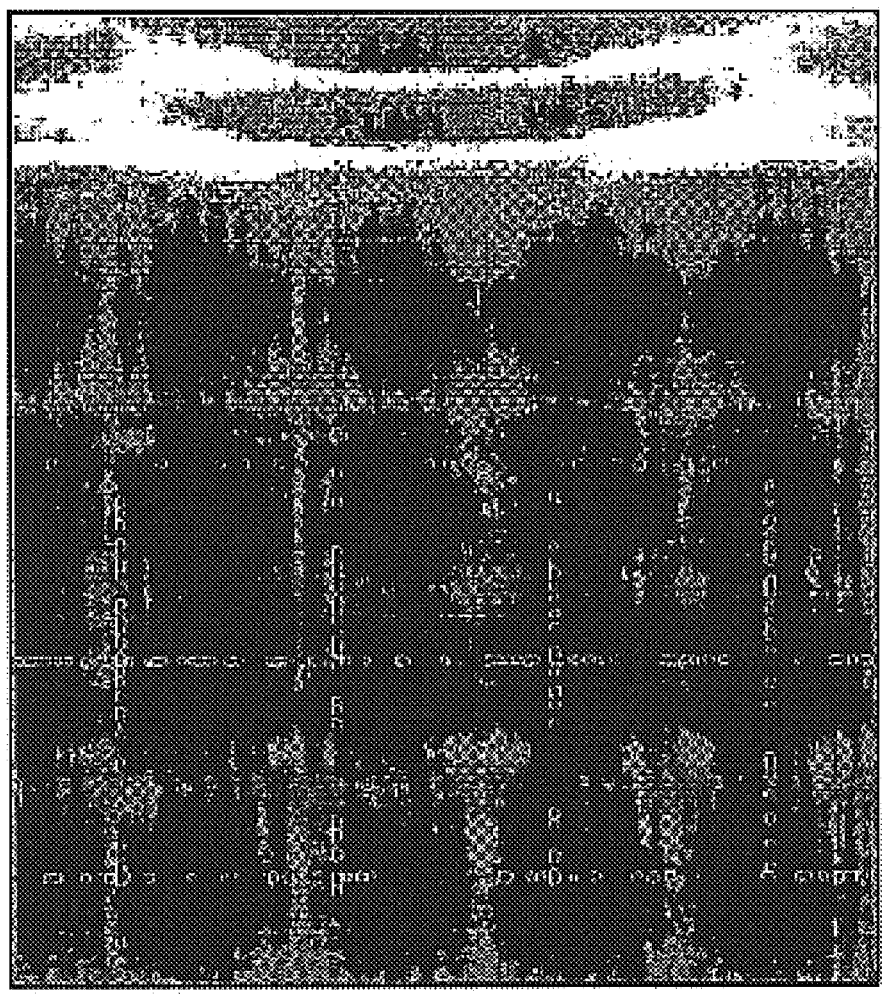
FIG. 4 shows a photoresist pattern of Invention Example 11.

The procedure of Example 8 was repeated but using the photoresist composition prepared in Example 4. The first pattern was flow baked at 157° C. for 90 seconds going through resist flow process to obtain 80 nm L/S pattern (see FIG. 4).

EXAMPLE 12

Figure 5:
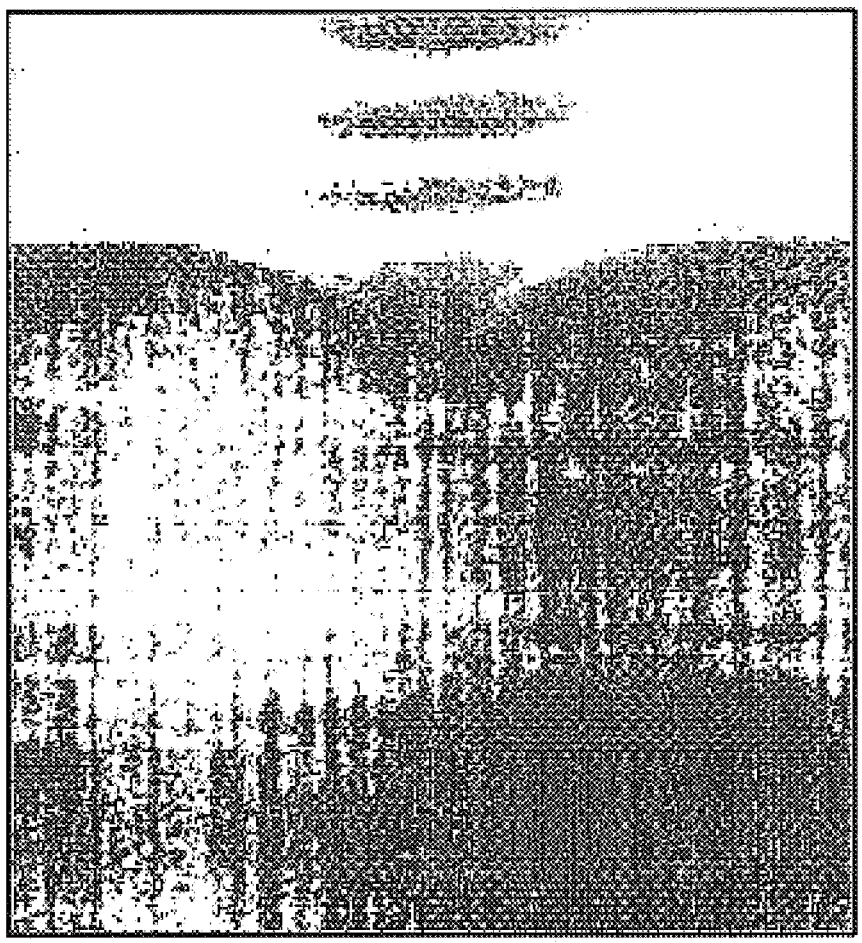
FIG. 5 shows a photoresist pattern of Invention Example 12.

The procedure of Example 8 was repeated but using the photoresist composition prepared in Example 5. The first pattern was flow baked at 163° C. for 90 seconds going through resist flow process to obtain 80 nm L/S pattern (see FIG. 5).

EXAMPLE 13

Figure 6:
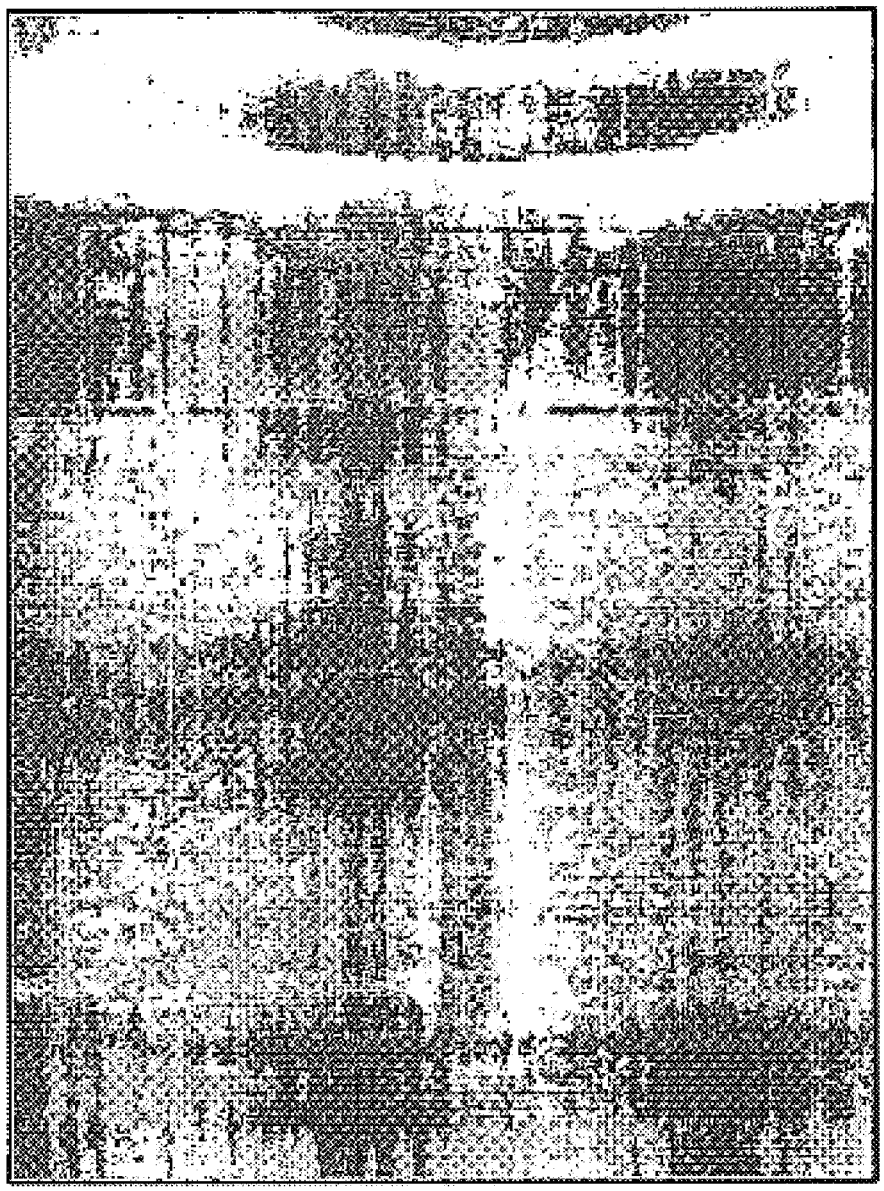
FIG. 6 shows a photoresist pattern of Invention Example 13.

The procedure of Example 8 was repeated but using the photoresist composition prepared in Example 6. The first pattern was flow baked at 163° C. for 90 seconds going through resist flow process to obtain 80 nm L/S pattern (see FIG. 6).

EXAMPLE 14

Figure 7:
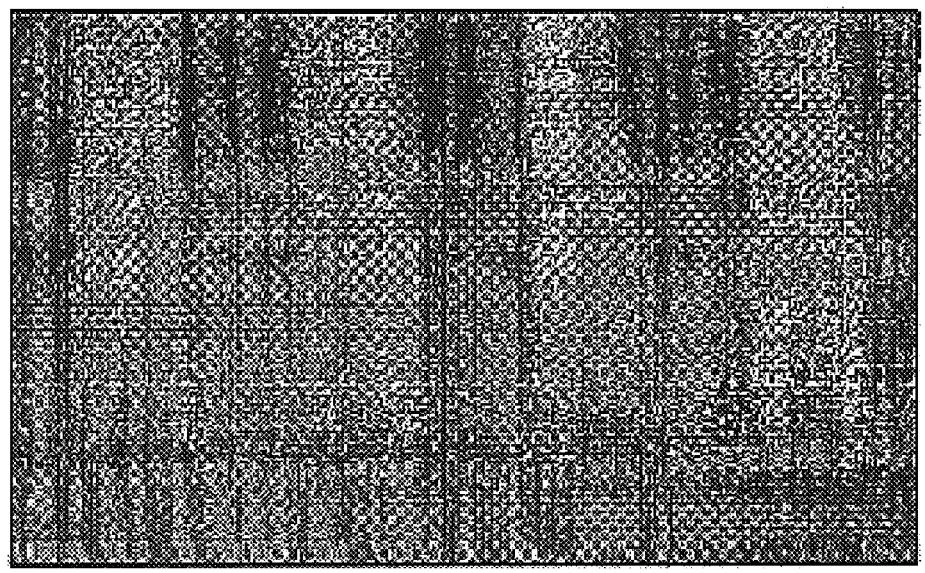
FIG. 7 shows a photoresist pattern of Invention Example 14.

The photoresist composition obtained using the procedure of Example 7 was coated on a wafer, soft-baked at 110° C. for 90 seconds and exposed to light using a 0.06 NA ArF ISI stepper. The photoresist composition was post-baked at 120° C. for 90 seconds and developed in 2.38 wt % aqueous TMAH solution to obtain a 120 nm L/S pattern (see FIG. 7). As shown in FIG. 7, the contrast ratio of the resulting pattern was very satisfactory.

Photoresist compositions of the present invention containing crosslinking agent of Formula 1 or 2 reduce or eliminate overflow during a resist flow process. Therefore, a contact hole pattern having a higher resolution (i.e., smaller in size) than the resolution of an exposing device can be formed using photoresist compositions of the present invention. Furthermore, unlike conventional photoresist compositions which produce various contact hole sizes during resist flow process, photoresist compositions of the present invention allow formation of a uniformly sized contact holes below 100 nm. Moreover, use of photoresist compositions of the present invention also reduces or eliminates standing wave effect.

The foregoing discussion of the disclosed compositions and methods has been presented for purposes of illustration and description. The foregoing is not intended to limit the invention to the form or forms disclosed herein. Although the detailed description has included description of one or more embodiments and certain variations and modifications, other variations and modifications are within the scope of the invention, e.g., as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed:

1. A photoresist composition for resist a flow process comprising:

a photoresist polymer selected from the group consisting of Formulas 3 through 5; a photoacid generator; a crosslinking agent selected from the group consisting of compounds of Formulas 1 and 2; and an organic solvent;

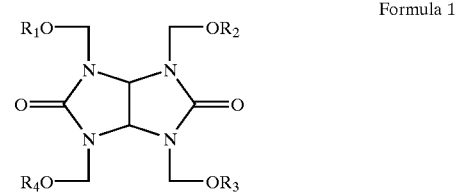

Formula 1 wherein $R_1$, $R_2$, $R_3$ and $R_4$ individually represent H or $C_1$–$C_{10}$ alkyl;

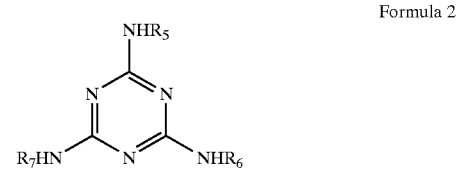

Formula 2 wherein $R_5$, $R_6$ and $R_7$ are individually selected from the group consisting of H, $C_1$–$C_{10}$ alkyl and $C_1$–$C_{10}$ alkoxy;

Formula 3

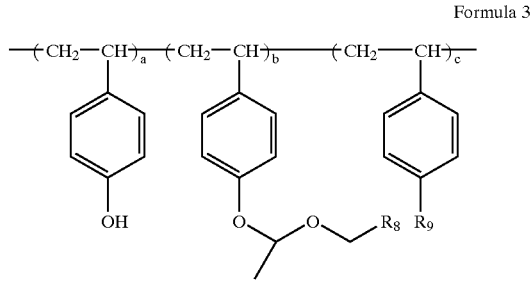

wherein $R_8$ and $R_9$ are individually selected from the group consisting of H, $C_1$–$C_{10}$ alkyl and $C_3$–$C_{20}$ aryl; and the ratio of a:b:c is 20~70 mol %: 10~70 mol %: 0~50 mol %;

Formula 4

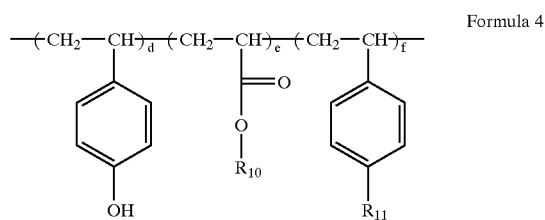

wherein $R_{10}$ is an acid labile protecting group;
$R_{11}$ is selected from the group consisting of H, $C_1$–$C_{10}$ alkyl and $C_3$–$C_{20}$ aryl; and
the ratio of d:e:f is 20~70 mol %: 10~70 mol %: present in an amount up to 50 mol %;

Formula 5

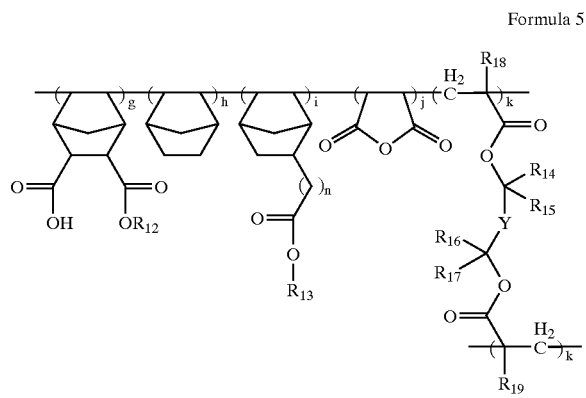

wherein $R_{12}$ is selected from the group consisting of H, $C_1$–$C_{10}$ alkyl and $C_1$–$C_{10}$ alkyl alcohol;
$R_{13}$ is an acid labile protecting group;
$R_{14}$, $R_{15}$, $R_{16}$ and $R_{17}$ are individually selected from the group consisting of H and $C_1$–$C_{10}$ alkyl;
$R_{18}$ and $R_{19}$ are individually selected from the group consisting of H and $CH_3$;
Y is $C_1$–$C_{10}$ alkylene or $C_1$–$C_{10}$ alkylene containing an ether (—O—) group;
n is an integer ranging from 0 to 2; and
the ratio of g:h:i:j:k is 1~20 mol % 0~20 mol %: 10~50 mol %: 40~50 mol %: 0~10 mol %.

2. The photoresist composition according to claim 1, wherein the compound of Formula 1 is 1,3,4,6-tetrakis (butoxy methyl)glycoluril.

3. The photoresist composition according to claim 1, wherein the compound of Formula 2 is melamine.

4. The photoresist composition according to claim 1, wherein the acid labile protecting group is selected from the group consisting of tert-butyl, tetrahydropyran-2-yl, 2-methyltetrahydropyran-2-yl, tetrahydrofuran-2-yl, 2-methyltetrahydrofuran-2-yl, 1-methoxypropyl, 1-methoxy-1-methylethyl, 1-ethoxypropyl, 1-ethoxy-1-methylethyl, 1-methoxyethyl, 1-ethoxyethyl, t-butoxyethyl, 1-isobutoxyethyl and 2-acetylmenth-1-yl.

5. The photoresist composition according to claim 1, wherein the amount of said crosslinking agent ranges from 1 to 20% by weight of the photoresist polymer.

6. The photoresist composition according to claim 1, wherein the photoacid generator comprises the compound selected from the group consisting of diphenyl iodide hexafluorophosphate, diphenyl iodide hexafluoroarsenate, diphenyl iodide hexafluoroantimonate, diphenyl p-metihoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate, dibutyl-naphthylsulfonium triflate and mixture thereof.

7. The photoresist composition according to claim 1, wherein the photoacid generator is used in an amount ranging from 0.01 to 10 wt % based on an amount of the photoresist polymer employed.

8. The photoresist composition according to claim 1, wherein the organic solvent is selected from the group consisting of diethylene glycol diethyl ether, propylene glycol methyl ether acetate, ethyl lactate, methyl 3-methoxypropionate, ethyl 3-ethoxypropionate, 2-heptanone and cyclohexanone.

9. The photoresist composition according to claim 1, wherein an amount of the organic solvent used ranges from 100% to 2000% by weight of the photoresist polymer.

* * * * *

UNITED STATES PATENT AND TRADEMARK OFFICE
CERTIFICATE OF CORRECTION

PATENT NO. : 6,824,951 B2
DATED : November 30, 2004
INVENTOR(S) : Geun Su Lee et al.

It is certified that error appears in the above-identified patent and that said Letters Patent is hereby corrected as shown below:

Column 8,
Line 34, after "composition for" please delete "resist a flow" and insert -- a resist flow -- in its place.

Column 10,
Lines 9-10, after "the raio of g:h:l:j:k is" please delete "1~20 mol % 0-20 mol %: 10~50 mol %: 40~50 mol %: 0~10 mol %." and insert -- 1~20 mol% : 0~20mol% : 10~50 mol% : 40~50 mol% : 0~10 mol%. -- in its place.
Line 33, please delete "p-metihoxyphenyl" and insert -- p-methoxyphenyl -- in its place.

Signed and Sealed this

Seventeenth Day of May, 2005

JON W. DUDAS
*Director of the United States Patent and Trademark Office*